United States Patent [19]

Nitsche et al.

[11] Patent Number: 4,619,740

[45] Date of Patent: Oct. 28, 1986

[54] METHOD OF MEASURING CURRENT DENSITY IN ELECTROPLATING BATHS

[75] Inventors: Detlev Nitsche; Rolf Rolff, both of Berlin, Fed. Rep. of Germany

[73] Assignee: Schering Aktiengesellschaft, Berlin and Bergkamen, Fed. Rep. of Germany

[21] Appl. No.: 713,266

[22] Filed: Mar. 18, 1985

[30] Foreign Application Priority Data

Mar. 22, 1984 [DE] Fed. Rep. of Germany ....... 3410875

[51] Int. Cl.$^4$ ............................................... C25D 5/02
[52] U.S. Cl. .................................................... 204/15
[58] Field of Search ........................ 204/1 T, 15, 434

[56] References Cited

U.S. PATENT DOCUMENTS 3,128,371   4/1964   Spaulding ........................... 204/1 T
4,461,690   7/1984   Rolff ................................... 204/1 T

*Primary Examiner*—T. M. Tufariello
*Attorney, Agent, or Firm*—Michael J. Striker

[57] ABSTRACT

A method for measuring the density of a current during an electroplating process in an electroplating bath, wherein a voltage is measured by a voltmeter, positioned outside the bath, immediately between the outer surface of the item to be electroplated and the outer surface of an isolated metallic island.

3 Claims, No Drawings

METHOD OF MEASURING CURRENT DENSITY IN ELECTROPLATING BATHS

BACKGROUND OF THE INVENTION

The present invention relates to a method of measurement of current density in electroplating baths during a galvanizing process, particularly for electroplating printed circuit boards.

It has been known that a density of a current flowing about the object to be electroplated can vary as a result of, for example, unequal distances of the objects from the anodes through which direct current flows. Electroplating baths of the type under consideration have been commonly known. One of them with a measuring system has been disclosed, for example, in applicant's U.S Pat. No. 4,461,690.

During the operation of electroplating baths various sources of errors occur, which cause undesired galvanizing deposits due to defective current density distribution in the electroplating bath. As such error sources can be, for example, an insufficient anode contact, erroneously selected stray disks, an inadequate advancement of the objects to be electroplated, or a non-uniform air blasting. The elimination of these sources of errors has been possible up to now by very expensive inspections of the electroplating bath and by the control of the electroplated objects.

SUMMARY OF THE INVENTION

It is an object of the present invention to provide an improved method of measuring a current density during the galvanizing process in order to establish eventual errors as soon as possible and to eliminate them before the end of the galvanizing process.

This and other objects of the invention are attained by a method for measuring a current density in electroplating baths during a galvanizing process, particularly for electroplating printed circuit boards, comprising the steps of applying onto an upper surface of an object to be electroplated an isolated metallic island; and measuring the current density directly on the upper surface of the object to be electroplated by measuring a voltage between the object and said metallic island.

The measuring step may be carried out by means of a voltmeter arranged outside an electroplating bath and connected with ends of an insulated metallic wire which in turn connects the upper surface of the object to be electroplated with said metallic island.

The voltmeter may be connected with the ends of said metallic wire by another insulated metallic wire.

The objects of the invention are also attained by a device for measuring a current density in electroplating baths during a galvanizing process, particularly for electroplating printed circuit boards, compriring an insulated metallic wire connecting an upper surface of the object to be electroplated with an isolated metallic island provided on said object; and a voltmeter arranged outside of an electroplating bath and connected with ends of said insulated metallic wire.

DETAILED DESCRIPTION OF THE PREFERRED EMBODIMENT

According to the method of the present invention a metallic island is provided on the upper surface of the object to be electroplated, for example, a printed circuit board, which island is isolated from the circuit. The measuring is carried out by a voltmeter positioned outside the bath. The measuring is performed directly on the upper surface of the object, in which the voltage is measured between the object and the metallic island by means of the voltmeter.

Due to the proposed method the measurement of the current densities at a plurality of spots of the objects to be electroplated and at all desired places of the electroplating bath during operation makes it possible that eventual errors in electroplating will be eliminated.

For example, in the copper-plating bath for coating printed circuit boards more than 100 places can be examined in which various voltages would lead to a common switch place.

It is, of course, understood that individual voltage values must be estimated to obtain current density values.

A gauging of the devices necessary for carrying out the method is required before performing the method.

It will be understood that each of the elements described above, or two or more together, may also find a useful application in other types of methods of measuring current densities differing from the types described above.

While the invention has been illustrated and described as embodied in a method of measuring current densities in electroplating baths, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic of specific aspects of this invention.

What is claimed as new and desired to be protected by Letters Patent is set forth in the appended claims:

1. In a method for measuring a current density in electroplating baths during a galvanizing process for electroplating printed circuit boards, the improvement comprising the steps of applying to a conductive area of an upper surface of a printed circuit board to be electroplated an isolated metallic island; and measuring the current density directly on the upper surface of the printed circuit board to be electroplated by measuring a voltage between the printed circuit board and said metallic island.

2. The method as defined in claim 1, wherein said measuring is carried out by means of a voltmeter arranged outside an electroplating bath and wherein two isolated wires are provided, which are connected to said voltmeter and to ends of a further isloated metallic wire, said further isolated metallic wire connecting said metallic island with the conductive area of the upper surface of the printed circuit board to be electroplated.

3. The method as defined in claim 1, wherein said measuring step is carried out in a plurality of places in an electroplating bath.

* * * * *